US011809255B2

(12) United States Patent
Hooshyar

(10) Patent No.: US 11,809,255 B2
(45) Date of Patent: Nov. 7, 2023

(54) METHOD FOR PREDICTING SERVICE LIFE OF A BATTERY UNIT

(71) Applicant: VOLVO TRUCK CORPORATION, Gothenburg (SE)

(72) Inventor: Hamed Hooshyar, Gothenburg (SE)

(73) Assignee: VOLVO TRUCK CORPORATION, Gothenburg (SE)

( * ) Notice: Subject to any disclaimer, the term of this patent is extended or adjusted under 35 U.S.C. 154(b) by 0 days.

(21) Appl. No.: 17/456,272

(22) Filed: Nov. 23, 2021

(65) Prior Publication Data

US 2022/0171450 A1    Jun. 2, 2022

(30) Foreign Application Priority Data

Nov. 27, 2020    (EP) ..................................... 20210233

(51) Int. Cl.
*G06F 1/28*    (2006.01)
*G06F 1/3212*    (2019.01)

(52) U.S. Cl.
CPC .............. *G06F 1/3212* (2013.01); *G06F 1/28* (2013.01)

(58) Field of Classification Search
CPC ................................. G06F 1/28; G06F 1/3212
See application file for complete search history.

(56) References Cited

FOREIGN PATENT DOCUMENTS

| CN | 110554322 A | * | 12/2019 | ........... G01R 31/367 |
|----|-------------|---|---------|------------------------|
| DE | 102016220860 A1 | | 4/2018 | |
| WO | WO-2005003799 A2 | * | 1/2005 | ........... B60L 11/1857 |

OTHER PUBLICATIONS

Marco Rehme et al: "CoFAT 2016—Second-Life Battery Applications—Market potentials and contribution to the cost effectiveness of electric . . . ", May 1, 2016 (May 1, 2016), pp. 1-8, Retrieved from the Internet: URL:https://www.researchgate.net/profile/Marco_Rehme/publication/308022452_CoFAT 2016_-_Second-Life_Battery_Applications_Market_potentials_and_contribution_to_the_cost_effectiveness_of_electric vehicles/links/580605ae08ae0075082bd66d/CoFAT-2016-Second-Life-Battery-Applications-Market-potentials-and-co.

Swierczynski Maciej et al: "Calendar ageing of LiFePO4/C batteries in the second life applications", 2017 19th European Conference on Power Electronics and Applications (EPE'17 ECCE Europe), Sep. 11, 2017, DOI: 10.23919/EPE17ECCEEUROPE.2017.8099173.

(Continued)

*Primary Examiner* — Mark A Connolly
(74) *Attorney, Agent, or Firm* — Venable LLP; Jeffri A. Kaminski

(57) ABSTRACT

A method for predicting service life of a battery unit previously used within at least one first application, the method comprising: assessing a battery capacity of the battery unit at an end of a first service life of the battery unit within the at least one first application, identifying a suitable second application for the battery unit by comparing the assessed battery capacity to given power requirements of at least one suggested second application, obtaining ageing data indicative of battery ageing of the battery unit in its at least one first application, predicting an expected second service life of the battery unit in the identified second application based on at least information relating to a planned usage of the battery unit in the second application and on the obtained ageing data from the at least one first application.

10 Claims, 3 Drawing Sheets

(56) References Cited

OTHER PUBLICATIONS

Gibert Cruz et al: Use of a Second Life Battery System from PHEV in Stationary Applications, Jun. 1, 2015, pp. 1-10, Retrieved from the Internet: URL:https://www.researchgate.net/profile/Lluc_Canals_Casals/publication/284409640_Sunbatt_Use_of_a_Second_Life_Battery_System_from_PHEV_in_Stationary_Applications/links/5652c59008ae 1 ef929759645/Sun batt-Use-of-a-Second-Life-BatterySystem-from-PH EV-in-Stationary-Applications.pdf?origin=publication_detail.
European Search Report dated May 10, 2021 in corresponding European Patent Application No. 20210233.1, 9 pages.

* cited by examiner

METHOD FOR PREDICTING SERVICE LIFE OF A BATTERY UNIT

TECHNICAL FIELD

The invention relates to a method for predicting service life of a battery unit. The invention further relates to a computer program, a computer readable medium, and a control unit.

BACKGROUND

Batteries are becoming a more common source of power for providing propulsion for vehicles, also for heavy duty vehicles such as buses and trucks. Such batteries are often rechargeable batteries and typically include a number of battery cells that may be connected in series or in parallel forming a complete battery pack for the vehicle. The vehicle may be provided with several such battery packs, depending on the requirements of a user of the vehicle.

A battery has however a limited service life during which it is able to meet demands on e.g. available energy and power in the vehicle application. When the battery is no longer able to meet the demands, it may be used in other, less demanding, second applications. The residual value in terms of state of health (SoH) of the battery when it reaches the end of its first service life, such as in the vehicle application, has been studied before. This residual value may be used to determine a suitable second application for the battery unit.

However, in many cases the actual usage of the vehicle may differ from the planned usage. Because of this, the first service life of the battery packs may be affected. For example, if the usage is harsher than planned, the first service life decreases and the performance of the battery packs will over time deteriorate more than the user expects. This may likewise be the situation in the second application of the battery unit. It is therefore desirable to be able to make a prediction of the service life of the battery unit when used in a second application.

SUMMARY

A primary object of the invention is to provide an, in at least some aspect, improved method for predicting service life of a battery unit. In particular, it is an object to provide a method that enables prediction of remaining service life of a battery unit in a second application, subsequent to being used in a first application.

According to a first aspect of the invention, a computer-implemented method for predicting service life of a battery unit previously used within at least one first application is provided, the method comprising:
- assessing a battery capacity of the battery unit at an end of a first service life of the battery unit within the at least one first application,
- identifying a suitable second application, subsequent to the at least one first application, for the battery unit by comparing the assessed battery capacity to given power requirements of at least one suggested second application,
- obtaining ageing data indicative of battery ageing of the battery unit in its at least one first application,
- predicting an expected second service life of the battery unit in the identified second application based on at least information relating to a planned usage of the battery unit in the second application and on the obtained ageing data from the at least one first application.

By combining ageing data from the first application, i.e. data describing a degradation of the battery unit over time, and information relating to the planned usage in the second application, it is possible to make an accurate first prediction of the expected second service life of the battery unit in its second application.

The information relating to the planned usage of the battery unit may for example be information relating to planned use cycles of the battery unit, such as charge and discharge cycles. The information may further relate to a planned state of charge (SoC) window, temperature, charge rate and capacity throughput of the battery unit. The SoC window is to be understood as a SoC range between a minimum SoC value and a maximum SoC value within which the battery unit is planned to be used.

By the first service life of the battery unit is herein intended the service life in the first application of the battery unit, i.e. a time period from the beginning of the first service life, the battery unit having 100% of its original capacity, corresponding to a state of health, SoH, of 100%, to an end of the service life in the first application, the battery unit having a first predefined amount or ratio left of its original capacity, such as e.g. 80%, 70% or 60% of the original capacity, depending on the first application. This corresponds to a first residual value of the SoH after the first service life. Assessing the battery capacity of the battery unit at the end of the first service life may be understood as determining the SoH of the battery unit.

By the second service life of the battery unit is intended the service life in the second application of the battery unit, i.e. a time period from the end of the first service life, the battery unit having the first predefined amount or ratio left of its original capacity, to an end of the service life in the second application, the battery unit having a second predefined amount or ratio left of its original capacity, lower than the first predefined amount. The second predefined amount, corresponding to a second residual value of the SoH after the second service life, is set in dependence on requirements of the second application.

The ageing data indicative of battery ageing in the first application may be data relating to SoH degradation of the battery unit in the first application, such as an ageing curve describing SoH of the battery unit as a function of time until the end of the first service life. It may also be data relating to use cycles of the battery unit in the first application, such as charge and discharge cycles. The data may further contain information relating to a SoC window in which the battery unit was operated in the first application, temperature, charge rate and capacity throughput.

The at least one first application of the battery unit may be within an electric energy storage system of a vehicle or a vessel, such as a heavy-duty vehicle. The second application may typically be a less demanding application in terms of power and energy, for example in a stationary energy storage system, such as an energy storage system of a residential area or similar.

Optionally, predicting the expected second service life of the battery unit comprises:
- creating a set of battery usage classifications,
- for each battery usage classification, determining at least one expected ageing curve associated with that battery usage classification,
- classifying the planned usage of the battery unit in accordance with the set of battery usage classifications, wherein the prediction of the expected second service life is determined based on the at least one expected ageing curve of the battery usage classification associated with the classified planned usage.

The classification into different usage classifications, or usage categories, may be used to illustrate to the user of the battery unit in the second application how the usage of the battery unit affects its second service life. The classification may thereby facilitate communication with the user. As the ageing of the battery unit is dependent on several detailed technical parameters, these classifications simplifies the ageing behaviour and help end users to understand it easier. Optionally, each battery usage classification may be associated with a single expected ageing curve, or with a set of ageing curves represented by a single expected ageing curve. The battery usage classifications may be set so that differences in expected second service life between the classifications are significant.

A corresponding usage classification may be used within the first application of the battery unit. The ageing data indicative of battery ageing in the first application may thus contain information relating to a usage classification within the first application, such as mild, medium or harsh usage.

Optionally, each battery usage classification is associated with at least one set of predefined operating parameter ranges, and determining the at least one expected ageing curve comprises simulating ageing of the battery unit for operating parameter values within the at least one set of predefined operating parameter ranges. Ageing is thus simulated based on information relating to the planned usage in the second application, wherein the planned usage implies operating parameter values of the battery unit within certain operating parameter ranges.

Optionally, the simulation of ageing is performed based on battery cell operational data obtained in battery cell tests performed after an end of the first service life, wherein the battery cell tests are carried out for at least one type of battery cell comprised in the battery unit. The battery cell tests may be laboratory battery cell tests. The battery unit may comprise different types of battery cells, in which case battery cell tests for at least some of the different types of cells may be carried out. The battery cell tests may be carried out at least for the battery cell type(s) expected to have a major influence on the ageing behaviour of the battery unit. Commonly, the battery unit comprises battery cells of a single chemistry type, although the proposed method would be possible to use also for battery units comprising battery cells of different chemistry types.

Optionally, the battery cell tests are carried out on the same battery cell or battery cells tested in corresponding battery cell tests carried out at a beginning of the first service life of the battery unit, i.e. prior to using the battery unit in the at least one first application.

Optionally, the method further comprises:
during usage of the battery unit in the identified second application, obtaining operational data relating to an actual usage of the battery unit,
predicting an actual second service life of the battery unit in the second application based on at least the obtained operational data,
comparing the predicted actual second service life with the predicted expected second service life, thus obtaining a comparison result;
determining whether a predetermined notification criterion is fulfilled based on the comparison result,
generating a notification to a user of the battery unit if the predetermined notification criterion is fulfilled.

Predicting the actual second service life may be carried out repeatedly during the second life of the battery unit.

By comparing the predicted actual second service life, predicted based on operational data relating to an actual usage of the battery unit, and the predicted expected second service life, predicted based on information relating to the planned usage, it may be determined whether the actual second service life will deviate from the expected second service life. The generated notification, generated if the notification criterion is fulfilled, may be sent to the user such that the user may decide on a suitable action in view of the notification. Several different notification criteria may be defined, leading to generation of notifications with different information contents. A notification criterion may for example be defined such that it is considered fulfilled when the comparison result reveals that the predicted actual second service life does not meet the expected second service life, wherein the generated notification contains information relating to this. Another notification criterion may be defined so that it is considered fulfilled when the comparison result reveals that the predicted second service life meets the expected second service life. This may be important information to the user, in particular if earlier comparisons have indicated a deviation.

The operational data relating to the actual usage of the battery unit may be data obtained from various sensors and measurement devices of an electric energy storage system (ESS) in which the battery unit is arranged, or it may be operational data calculated based on such data. The operational data may for example include data relating to battery temperature, depth of discharge (DoD), state of charge (SoC), charging rate, and charging pattern.

Optionally, the method may further comprise:
providing information to the user of the battery unit relating to the predicted actual second service life of the battery unit.

The information may contain for example a reason for a predicted deviation, a size of the deviation, and/or a total predicted remaining second service life.

Optionally, predicting the actual second service life of the battery unit comprises classifying the actual usage of the battery unit in accordance with the set of battery usage classifications. The set of battery usage classifications may for example comprise at least three different classifications. These may for example include light, medium and harsh usages.

The classification of the actual usage may be continuously updated during the second service life of the battery unit. The classification of the actual usage facilitates communication regarding the predicted second service life with the user of the battery unit, since it illustrates why, for example, the actual second service life deviates from the predicted second service life in a particular case. The classification of the actual usage may be carried out by comparing the operational data relating to the actual usage of the battery unit with the at least one set of predefined operating parameter ranges associated with the battery usage classifications.

Optionally, the predicted actual second service life of the battery unit is determined based on the at least one expected ageing curve of the battery usage classification associated with the classified actual usage. This is a computationally efficient and straightforward way of determining the predicted actual second service life.

Optionally, the predetermined notification criterion is considered fulfilled if the battery usage classification associated with the classified actual usage differs from the battery usage classification associated with the classified planned usage. A notification may thereby be generated and sent to the user if the actual usage falls into a different usage classification than what was originally planned for, enabling the user to take a decision on how to proceed.

Optionally, the predetermined notification criterion is considered fulfilled if the predicted actual second service life deviates from the predicted expected second service life by at least a predetermined amount. Such a notification criterion may be set up and used independently of battery usage classifications, but it may also be used in combination with such classifications.

Optionally, the method may further comprise:
  if the predetermined notification criterion is fulfilled, determining a reason for the deviation in the predicted actual second service life from the predicted expected second service life based on at least the obtained operational data.

Such information relating to the reason for the deviation may be important for the user to take an informed decision on a suitable course of action.

According to a second aspect of the present invention, there is provided a computer program comprising program code means for performing the method of any one of the embodiments of the first aspect when said computer program is run on a computer. Effects and features of the second aspect of the invention are largely analogous to those described above in connection with the first aspect.

According to a third aspect of the present invention, there is provided a computer-readable medium carrying a computer program comprising program means for performing the method of any of the embodiments of the first aspect when said program means is run on a computer. Effects and features of the third aspect of the invention are largely analogous to those described above in connection with the first aspect.

According to a fourth aspect of the present invention, there is provided a control unit configured to perform the method according to any one of the embodiments of the first aspect. Effects and features of the fourth aspect of the invention are largely analogous to those described above in connection with the first aspect.

Further features of, and advantages with, the present invention will become apparent when studying the appended claims and the following description. The skilled person realizes that different features of the present invention may be combined to create embodiments other than those described in the following, without departing from the scope of the present invention.

BRIEF DESCRIPTION OF THE DRAWINGS

With reference to the appended drawings, below follows a more detailed description of embodiments of the invention cited as examples.

In the drawings.

The drawings are schematic and not necessarily drawn to scale.

DETAILED DESCRIPTION OF EXAMPLE EMBODIMENTS OF THE INVENTION

Figure 1:
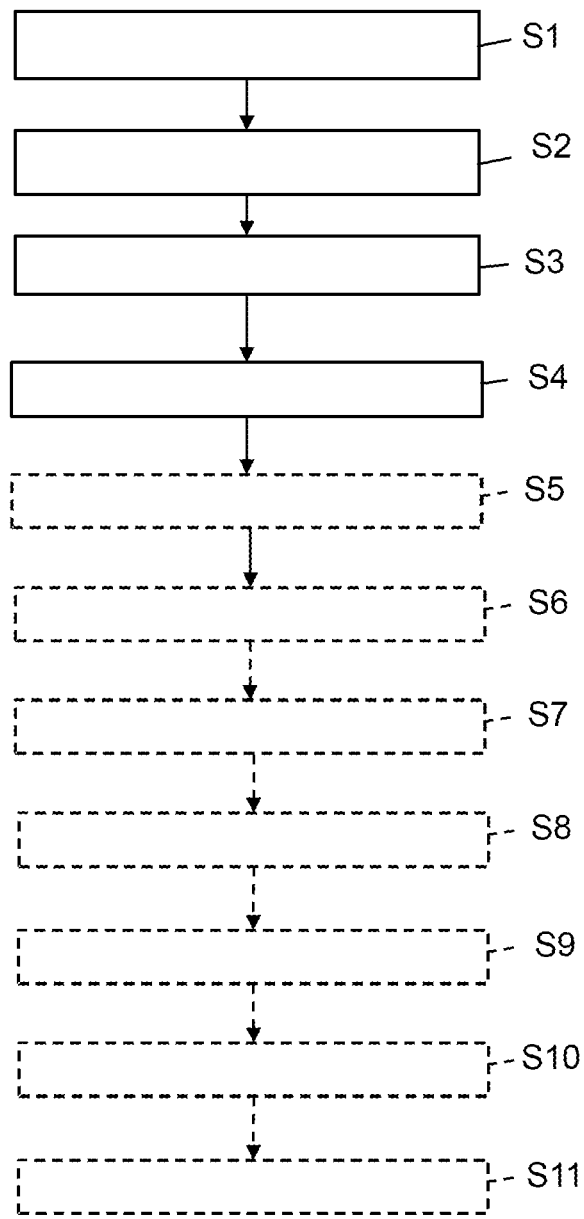
FIG. 1 is a flow-chart illustrating a method according to an embodiment of the invention.

A method for monitoring service life of a battery unit, previously used within a first application, or within more than one first applications, is schematically illustrated in the flow chart of FIG. 1. Optional steps are marked with dashed lines. The battery unit (not shown), may be a battery pack or a battery module which has, in its first application, been used in an electric energy storage system, ESS, of a vehicle. Such a battery unit comprises a plurality of battery cells connected in series and/or in parallel to provide an output direct current (DC) at a desired voltage level. Suitably, the battery cells may be of lithium-ion type, but other types may also be used. The number of battery cells per battery pack may typically be in the range of 50 to 500 cells.

The method is computer-implemented and may e.g. be performed in a control unit (now shown).

In a first step S1, a battery capacity of the battery unit is assessed at an end of a first service life of the battery unit within the first application, such as in a vehicle application. In this step, the battery state of health, SoH, may be determined in terms of a percentage of the original capacity, or SoH, of the battery unit prior to being used in the first application.

In a second step S2, a suitable second application for the battery unit is identified by comparing the assessed battery capacity of the battery unit to given power requirements of at least one suggested second application. The suitable second application should be an application in which the assessed battery capacity of the battery unit is such that the given power requirements can be fulfilled. Typically, such a suitable second application may be within a stationary electric energy storage system, for example of a residential area or similar, wherein the electric energy storage system is connected to a power grid.

In a third step S3, ageing data indicative of battery ageing of the battery unit in its at least one first application are obtained. This ageing data may e.g. comprise an ageing curve of the battery unit within the first application, describing the battery SoH as a function of time, as will be further described below.

In a fourth step S4, an expected second service life of the battery unit in the identified second application is predicted, based on at least information relating to a planned usage of the battery unit in the second application and on the obtained ageing data from the at least one first application. The information relating to the planned usage may be provided by a user of the battery unit. For example, the user may provide information that makes it possible to predict expected temperature ranges and charging and discharging cycles of the battery unit. The expected second service life may be predicted based on simulations as will be further described below.

Figure 2:
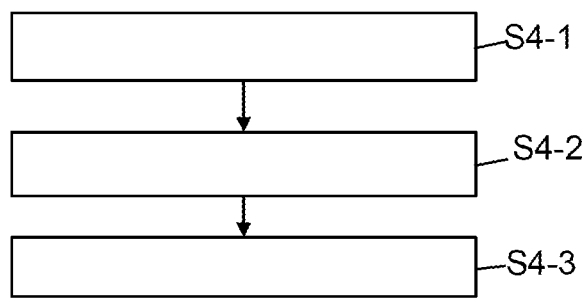
FIG. 2 is another flow-chart illustrating a method according to an embodiment of the invention.

The fourth step S4 of predicting the expected second service life of the battery unit may comprise a series of substeps, as illustrated in FIG. 2:

S4-1) Creating a set of battery usage classifications, such as two or three different battery usage classifications, wherein each battery usage classification may be associated with at least one set of predefined operating parameter ranges. Such usage classifications may include e.g. light, medium and harsh usages, each being associated with predefined operating parameter ranges in terms of e.g. temperature, depth of discharge (DoD), state of charge (SoC), charging rate, and/or charging pattern of the battery unit.

Figure 3:
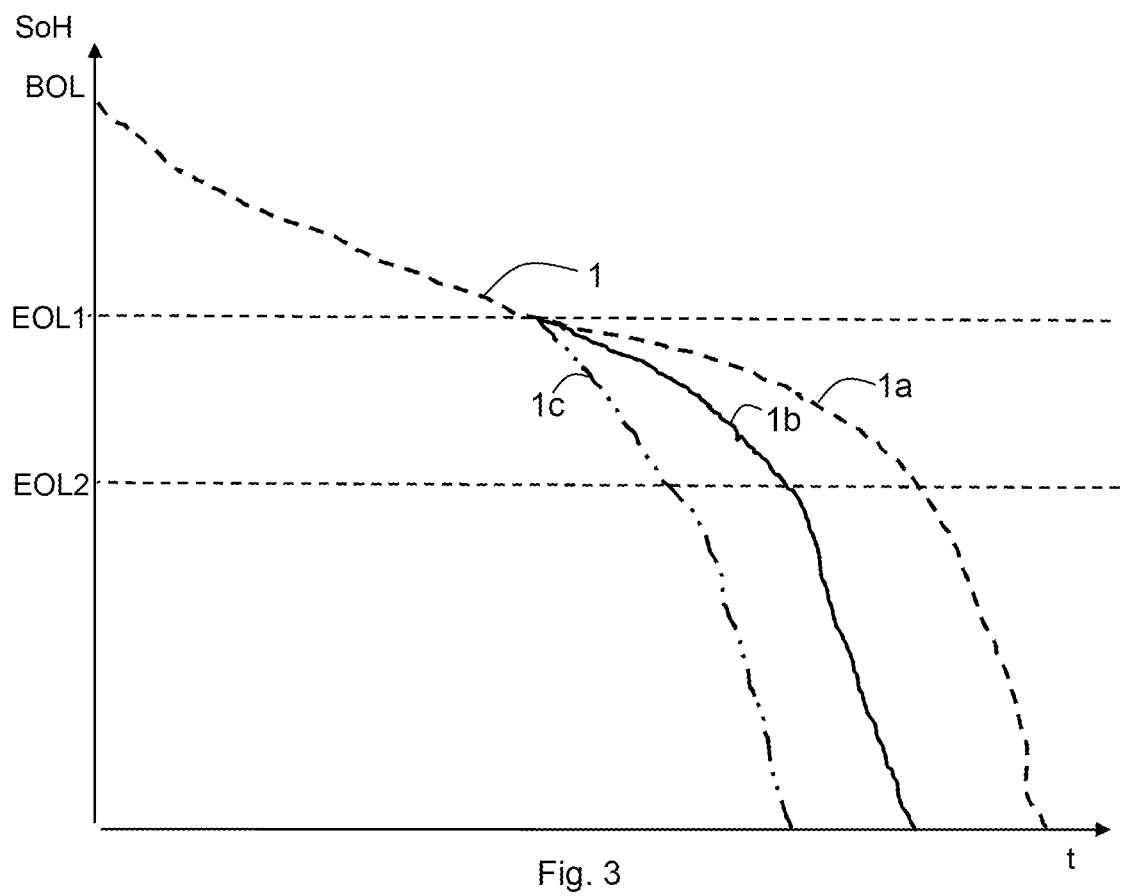
FIG. 3 is a diagram showing ageing curves of a battery unit.

S4-2) For each battery usage classification, determining at least one expected ageing curve associated with that battery usage classification. This may be performed by simulating ageing of the battery unit for operating parameter values within the at least one set of predefined operating parameter ranges. Exemplary second life ageing curves 1a, 1b, 1c are illustrated in FIG. 3, corresponding to light usage 1a, medium usage 1b, and harsh usage 1c, respectively, in the second application of the battery unit. In the first application, the battery unit has been aged in accordance with a first life ageing curve 1 from a beginning of life, BOL to an end of the first service life, EOL1. All ageing curves 1, 1a, 1b, 1c describe State of Health, SoH, as a function of time t, wherein the end of the first service life EOL1 is a predefined level of SoH at which the battery unit does no longer meet predefined criteria for the first application. For example, this may be at a SoH level of 80%. If the user acquires a battery unit with a capacity of 100 kWh and intends to use it for eight years in the first application, with a usage corresponding to a medium usage 2, the battery capacity of the battery unit should in this case be 80 kWh after this first time period. The end of the second service life, EOL2, is defined as a predefined level of SoH at which the battery unit does no longer meet predefined criteria for the second application. After the end of the second service life EOL2, the battery unit may be recycled, or a third application having even lower power requirements may be identified.

As can be seen from the curves, light usage 1a leads to the longest expected second service life, whereas harsh usage 1c leads to the shortest expected second service life. The expected second life ageing curves may be determined by simulating ageing of the battery unit for operating parameter values within the predefined operating parameter ranges corresponding to the different classifications. The simulation of ageing may advantageously be performed based on battery cell operational data obtained in laboratory battery cell tests after the end of the first service life EOL1, wherein the battery cell tests are carried out for at least one type of battery cell comprised in the battery unit. The battery cell tests may be carried out on the same battery cell or battery cells tested in corresponding battery cell tests carried out at a beginning of the first service life BOL of the battery unit.

S4-3) Classifying the planned usage of the battery unit, i.e. the operating parameter values which are expected to be used in the second application of the battery unit, in accordance with the set of battery usage classifications. The prediction of the expected second service life may now be determined based on the expected second life ageing curve of the battery usage classification associated with the classified planned usage, such as the curves corresponding to light usage 1a, medium usage 1b, and harsh usage 1c.

In an optional fifth step S5, carried out repeatedly during usage of the battery unit in the identified second application, operational data relating to an actual usage of the battery unit are obtained. This may be realized by collecting measurement data obtained from various sensors and measurement devices of an electric energy storge system in which the battery unit is arranged, and also by deriving calculated or estimated operational data based on such measurement data. The operational data may for example include measurement data relating to temperature, such as battery temperature and ambient temperature. It may also include operational data relating to depth of discharge (DoD), state of charge (SoC), charging rate, and charging pattern of the battery unit.

In a further optional step S6, an actual second service life of the battery unit in the second application is predicted based on at least the obtained operational data. The actual second service life is herein defined as the time between the end of the first service life EOL1 and the end of the second service life EOL2 in the second application of the battery unit, as illustrated by ageing curves 1a, 1b, 1c in FIG. 3.

The step S6 of predicting the actual second service life of the battery unit may comprise classifying the actual usage of the battery unit in the second application in accordance with the set of battery usage classifications. This may be carried out continuously, or at regular intervals, or at predetermined occasions, during use of the battery unit in the second application. Furthermore, the predicted actual second service life of the battery unit may be determined based on the expected ageing curve 1a, 1b, 1c of the battery usage classification associated with the classified actual usage. In the example given above, in which the user acquires a used battery unit with a capacity of 80 kWh, corresponding to a SoH of 80%, and intends to use it according to a medium usage 1b, the actual use of the battery unit may be such as to cause faster ageing of the battery unit. The actual usage may for example be classified as a harsh usage 1c, which will lead to reaching the end of the second service life EOL2, after less time than expected. Thus, depending on the actual usage, the predicted actual second service life may deviate significantly from the predicted expected second service life.

In an optional seventh step S7, the predicted actual second service life is compared with the predicted expected second service life, thus obtaining a comparison result.

In an optional eighth step S8, it is determined whether a predetermined notification criterion is fulfilled based on the comparison result obtained in the seventh step.

In an optional ninth step S9, a notification to a user of the battery unit is generated if the predetermined notification criterion is fulfilled. The predetermined notification criterion may for example be considered fulfilled if the predicted actual second service life deviates from the predicted expected second service life by at least a predetermined amount. Other predetermined notification criteria may additionally or alternatively be used. It is possible to use more than one such criteria, for example leading to different notifications being generated.

In an optional tenth step S10, which may be carried out if the predetermined notification criterion is fulfilled, a reason for the deviation in the predicted actual second service life from the predicted expected second service life is determined based on at least the obtained operational data.

In an optional eleventh step S11, information is provided to the user of the battery unit relating to the predicted actual second service life of the battery unit.

Figure 4:
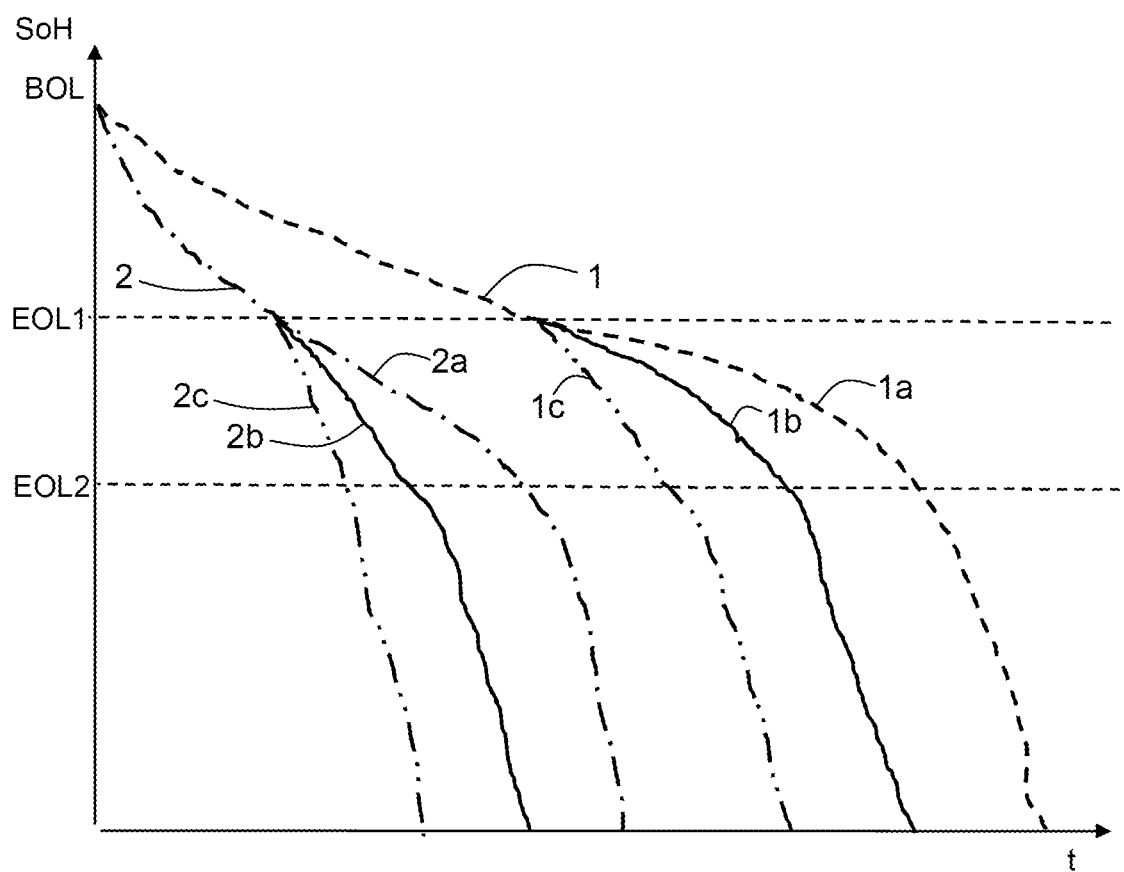
FIG. 4 is another diagram showing ageing curves of a battery unit.

The ageing data from the first application obtained in the third step S3 may be in the form of first life ageing curves. FIG. 4 illustrates two examples, in which the battery unit is in the first application aged either in accordance with a mild usage first life ageing curve 1, corresponding to a mild usage in the first application, or in accordance with a harsh usage first life ageing curve 2, corresponding to a harsh usage in the first application. The usage in the first application affects the ageing behaviour in the second application and has an effect on the predicted and actual second service life. For example, the rapid ageing associated with a harsh usage in the first application may render the battery unit unsuitable to be used in a second application associated with a harsh usage, illustrated by the second life ageing curve 2c, or with a medium usage illustrated by the second life ageing curve 2b. It may still be acceptable to use in a second application associated with a mild usage as illustrated by the second life ageing curve 2a. If the battery unit was instead aged mildly in accordance with the mild usage first life ageing curve 1 in the first application, it may be suitable for either one of the second life applications associated with a second life mild usage 1a, a medium usage 1b, and a harsh usage 1c.

The prediction of the expected second service life of the battery unit may be carried out already prior to using the battery unit in the first application, by simulating ageing of the battery unit within the first application and thereby obtain ageing data for use as input data in the prediction of the expected second service life. Alternatively, or additionally, the prediction of the expected second service life may be carried out based on actual ageing data obtained during actual use of the battery unit in the first application. For example, a user may expect to use the battery unit in the first application in accordance with the first life mild usage ageing curve 1 as illustrated in FIG. 4, having a particular second application in mind. As it turns out, the usage in the first application becomes more harsh, and the prediction of the second service life is accordingly adjusted during the first service life of the battery unit.

The control functionality of the example embodiments may be implemented using existing computer processors, or by a special purpose computer processor for an appropriate system, incorporated for this or another purpose, or by a hardwire system. Embodiments within the scope of the present disclosure include program products comprising machine-readable medium for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data that cause a general-purpose computer, special purpose computer, or special purpose processing machines to perform a certain function or group of functions.

It is to be understood that the present invention is not limited to the embodiments described above and illustrated in the drawings; rather, the skilled person will recognize that many changes and modifications may be made within the scope of the appended claims.

The invention claimed is:

1. A method for predicting service life of a battery unit previously used within at least one first application, the method comprising:
    assessing a battery capacity of the battery unit at an end of a first service life of the battery unit within the at least one first application,
    identifying a suitable second application for the battery unit by comparing the assessed battery capacity to given power requirements of at least one suggested second application,
    obtaining ageing data indicative of battery ageing of the battery unit in its at least one first application,
    predicting an expected second service life of the battery unit in the identified second application based on at least information relating to a planned usage of the battery unit in the second application and on the obtained ageing data from the at least one first application, wherein predicting the expected second service life of the battery unit comprises:
        creating a set of battery usage classifications,
        for each battery usage classification, determining at least one expected ageing curve associated with that battery usage classification, and
        classifying the planned usage of the battery unit in accordance with the set of battery usage classifications,
        wherein the prediction of the expected second service life is determined based on the at least one expected ageing curve of the battery usage classification associated with the classified planned usage,
    the method further comprising:
        during usage of the battery unit in the identified second application, obtaining operational data relating to an actual usage of the battery unit,
        predicting an actual second service life of the battery unit in the second application based on at least the obtained operational data by classifying the actual usage of the battery unit in accordance with the set of battery usage classifications,
        comparing the predicted actual second service life with the predicted expected second service life, thus obtaining a comparison result,
        determining whether a predetermined notification criterion is fulfilled based on the comparison result,
        generating a notification to a user of the battery unit if the predetermined notification criterion is fulfilled.

2. The method according to claim 1, wherein each battery usage classification is associated with at least one set of predefined operating parameter ranges, and wherein determining the at least one expected ageing curve comprises simulating ageing of the battery unit for operating parameter values within the at least one set of predefined operating parameter ranges.

3. The method according to claim 2, wherein the simulation of ageing is performed based on battery cell operational data obtained in battery cell tests performed after an end of the first service life, wherein the battery cell tests are carried out for at least one type of battery cell comprised in the battery unit.

4. The method according to claim 3, wherein the battery cell tests are carried out on the same battery cell or battery cells tested in corresponding battery cell tests carried out at a beginning of the first service life of the battery unit.

5. The method according to claim 1, wherein the predicted actual second service life of the battery unit is determined based on the at least one expected ageing curve of the battery usage classification associated with the classified actual usage.

6. The method according to claim 1, wherein the predetermined notification criterion is considered fulfilled if the battery usage classification associated with the classified actual usage differs from the battery usage classification associated with the classified planned usage.

7. The method according to claim 1, wherein the predetermined notification criterion is considered fulfilled if the predicted actual second service life deviates from the predicted expected second service life by at least a predetermined amount.

8. The method according to claim 1, wherein the at least one first application of the battery unit is within an electric energy storage system of a vehicle.

9. A non-transitory computer readable medium carrying a computer program comprising program code for performing the method according to claim 1 when said computer program is run on a computer.

10. A control unit configured to perform the method according to claim 1.

\* \* \* \* \*